US006657259B2

(12) United States Patent
Fried et al.

(10) Patent No.: US 6,657,259 B2
(45) Date of Patent: Dec. 2, 2003

(54) MULTIPLE-PLANE FINFET CMOS

(75) Inventors: David M. Fried, Williston, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/011,846

(22) Filed: Dec. 4, 2001

(65) Prior Publication Data

US 2003/0102497 A1 Jun. 5, 2003

(51) Int. Cl.[7] .......................... H01L 27/01; H01L 27/12; H01L 31/0392; H01L 29/04; H01L 31/036
(52) U.S. Cl. .................. 257/350; 257/351; 257/627; 257/628; 257/347
(58) Field of Search ............................... 257/255, 347, 257/350, 351, 527, 627, 628

(56) References Cited

U.S. PATENT DOCUMENTS

| 4,768,076 A | 8/1988 | Aoki et al. ................ 257/347 |
| 4,857,986 A | 8/1989 | Kinugawa .................. 257/369 |
| 4,933,298 A | 6/1990 | Hasegawa .................... 437/62 |
| 5,317,175 A | 5/1994 | Throngnumchai ........... 257/255 |
| 5,729,045 A | 3/1998 | Buynoski .................... 257/627 |
| 5,970,330 A | 10/1999 | Buynoski .................... 438/198 |

FOREIGN PATENT DOCUMENTS

| JP | 19840191542 | 4/1986 | ................. 257/369 |
| JP | 19880091701 | 10/1989 | ................. 257/351 |
| JP | 19900084808 | 12/1991 | ................. 257/351 |

*Primary Examiner*—Steven Loke
(74) *Attorney, Agent, or Firm*—Schmeiser, Olsen & Watts; William D. Sabo (57) ABSTRACT

The present invention provides FinFETs on the same substrate utilizing various crystal planes for FET current channels in order to optimize mobility and/or to reduce mobility. An embodiment of the present invention provides a substrate having a surface oriented on a first crystal plane that enables subsequent crystal planes for channels to be utilized. A first transistor is also provided having a first fin body. The first fin body has a sidewall forming a first channel, the sidewall oriented on a second crystal plane to provide a first carrier mobility. A second transistor is also provided having a second fin body. The second fin body has a sidewall forming a second channel, the sidewall oriented on a third crystal plane to provide a second carrier mobility that is different from the first carrier mobility.

13 Claims, 9 Drawing Sheets

MULTIPLE-PLANE FINFET CMOS

BACKGROUND OF THE INVENTION

1. Technical Field

The present invention relates generally to the field of semiconductor processing and, more specifically, to multiple-plane FinFET CMOS.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in complementary metal oxide semiconductor (CMOS) technologies such as the in the design and fabrication of field effect transistors (FETs). FETs are the basic electrical devices of today's integrated circuits and are used in almost all types of integrated circuit design (i.e., microprocessors, memory, etc.). FETs may be formed on conventional substrates. For example, a conventional CMOS PET formed on a silicon wafer may include a gate oxide layer formed on the wafer, a gate formed on the gate oxide layer, spacers formed beside the gate on the gate oxide layer, and doped source/drain (S/D) regions arranged on respective sides of a gate conductor. The gate is separated from a channel (which is situated between the s/D regions) by the gaze oxide layer. Shallow trench insulator (STI), local oxidation of silicon (LOCOS), or poly-bared LOCOS isolations are usually employed to provide for isolation of adjacent transistors. When the PET is operated, an electric field is grated by applying a voltage to the gate. The electrical field is used to control the channel situated between the S/D regions. For example, if the channel is turned on, the electrons flow from the source region to the drain region. In contrast, if the channel is turned oft the electrons cannot flow between the source region and the drain region. Therefore, the on or off state of the channel controls the connection or disconnection of the circuit.

Unfortunately, increased device density in CMOS technologies often results in degradation of performance and/or reliability. One type of FET that has been proposed to facilitate increased device density is a double gated FET (FinFET). FinFETs use two gates, one on each side of a fin body (i.e. transistor body), to facilitate scaling of CMOS dimensions, while maintaining an acceptable performance. In particular, the use of the double gate suppresses Short Channel Effects (SCE), provides for lower leakage, and provides for more ideal switching behavior. In addition, the use of the double gate increases gate area, which allows the FinFET to have better current control, without increasing the gate length of the device. As such, the FinFET is able to have the current control of a larger transistor without requiring the device space of the larger transistor.

Another way to facilitate scaling of CMOS dimensions, while maintaining an acceptable performance, is to increase the mobility of carriers in a semiconductor material. In CMOS technology, n-channel FETs use electrons as carriers and p-channel FETs use holes as carriers. When an electric field is applied to a semiconductor substrate, each of the carriers (i.e. holes and electrons) in the substrate will experience a force from the field and will be accelerated along the field in the opposite direction of the field. The velocity of the carriers due to this effect is called drift velocity and it is proportional to the applied electric field. This proportionality factor is known as mobility ($\mu$). The higher the mobility, the higher the current density the transistor will have, resulting in a faster the switching speed.

In conventional CMOS technologies, mobility of carriers is dependent on a number of factors, especially the surface plane of a wafer. That is, carriers see the periodicity of the atoms (the pattern the atoms form), which is completely determined by the crystal plane. Thus, planar devices always have the mobility associated with the plane on which they are formed, and rotating planar FET designs formed on the same crystal plane has no mobility effect.

Accordingly, conventional CMOS technologies use silicon substrates having a surface oriented on a (100) crystal plane. Conventional silicon substrates having a surface oriented on the (100) crystal plane are chosen because: (a) the surface state density between the silicon substrate and the silicon oxide film is at a minimum when the silicon substrate surface is oriented on the (100) plane; and (b) the mobility of electrons in the (100) plane is higher than in other crystal planes, and therefore, the source-drain current of a n-channel FET formed on the semiconductor substrate having the (100) plane provides the largest current. However, the mobility of holes is not optimized in the (100) plane, and therefore, the source-drain current of a p-channel FET formed on the semiconductor substrate having the (100) plane is inevitably small. The p-channel FET therefore fails to have desirable characteristics, even though the n-channel FET exhibits good characteristics. Hole mobility could be enhanced, especially at high electric fields, if p-channel FETs were formed on the (111) plane. However, because the (111) plane has a worse mobility for electrons, it is not used in conventional planar CMOS. In conventional planar CMOS, since utilizing different planes for different devices is impossible (i.e. since planar CMOS is "planar", both n-channel FETs and p-channel FETs must be on the same plane), the (100) plane provides a compromise between maximizing hole and electron mobilities.

Thus, there is a need for improved CMOS technologies utilizing various crystal planes for FET current channels in order to optimize mobility and/or reduce mobility in specific devices depending upon the particular application, thereby maintaining an acceptable and/or desired CMOS performance.

DISCLOSURE OF THE INVENTION

In contrast to conventional planar complementary metal oxide semiconductor (CMOS) technologies, namely in the design and fabrication of field effect transistors (FETs), the present invention may provide CMOS FinFETs on the same substrate utilizing various crystal planes for FET current channels without any complex device engineering. Additionally, since rotating a FinFET design according to the present invention, unlike rotating planar FET designs, changes the actual planar surface of the device, a mobility change may be realized. Thus, by forming multiple FinFETs on various crystal planes on the same substrate, multiple different carrier mobilities may be realized in order to optimize mobility and/or reduce mobility in specific devices as needed, thereby maintaining an acceptable and/or desired performance.

In association with a first embodiment of present invention, a semiconductor structure may include a substrate having a surface oriented on a first crystal plane that enables subsequent crystal planes for channels to be utilized. A first transistor may be included and may have a first fin body. The first fin body may have a sidewall forming a first current channel. The sidewall of the first fin body may be oriented on a second crystal plane to provide a first carrier mobility. A second transistor may also be included and may have a second fin body. The second fin body may have a sidewall forming a second current channel. The sidewall of the second fin body may be oriented on a third crystal plane to provide a second carrier mobility that is different from the first carrier mobility.

There are many exemplary variations of this first embodiment. Accordingly, in a first variation, the substrate may comprise single crystal silicon and/or the surface may be oriented on a {110} crystal plane. In a second variation, the sidewall of the first fin body may be oriented on a {n n m} plane, where n and m are any integer, and the sidewall of the second fin body may be oriented on a {a a b} plane, where a and b are any integer, such that the {n n m} plane and the {a a b} plane are not equivalent by a symmetry transformation.

In a third variation, the first transistor may be one of a first p-channel FinFET (PFET) and a first n-channel FinFET (NFET), and the second transistor may be one of a second PFET and a second NFET. The sidewall of the first fin body of one of the first PFET and the first NFET may be oriented on a second crystal plane to provide one of an optimized carrier mobility and a non-optimized carrier mobility, and the sidewall of the second fin body of one of the second PFET and the second NFET may be oriented on a third crystal plane to provide one of an optimized carrier mobility and a non-optimized carrier mobility.

Thus, in a fourth variation for example, the sidewall of the first fin body of one of the first PFET and the first NFET may be oriented on one of a {100} crystal plane, a {110} crystal plane, and a {111} crystal plane, and the sidewall of the second fin body of one of the second PFET and the second NFET may be oriented on one of a {100} crystal plane, a {110} crystal plane, and a {111} crystal plane. The {111} crystal plane optimizes carrier mobility for a PFET, and both the {100} crystal plane and the {110} crystal plane optimize carrier mobility for an NFET. On the other hand, the {100} crystal plane reduces carrier mobility for a PFET, and the {111} crystal plane reduces carrier mobility for an NFET.

In association with a second embodiment of present invention, a semiconductor structure may include a chip that may include a first single crystal semiconductor sidewall channel oriented on a first crystal plane. The semiconductor chip may also include a second single crystal semiconductor sidewall channel oriented on a second crystal plane different from the first crystal plane so that the first crystal plane is not equivalent to the second crystal plane by a symmetry transformation.

There are also many exemplary variations of this second embodiment. Accordingly, in a first variation, a first mobility may be associated with the first crystal plane and a second mobility may be associated with the second crystal plane, wherein the first mobility is different from the second mobility. In a second variation, the chip may comprise single crystal silicon and/or may have a surface oriented on a {110} crystal plane.

In a third variation, the first single crystal semiconductor sidewall channel may be part of a first FinFET (e.g. one of a first PFET and a first NFET) and the second single crystal semiconductor sidewall channel may be part of a second FinFET (e.g. one of a second PFET and a second NFET). One of the first PFET and the first NFET may be oriented on a second crystal plane to provide one of an optimized carrier mobility and a non-optimized carrier mobility, and one of the second PFET and the second NFET may be oriented on a third crystal plane to provide one of an optimized carrier mobility and a non-optimized carrier mobility.

Thus, in a fourth variation for example, one of the first PFET and the first NFET may be oriented on one of a {100} crystal plane, a {110} crystal plane, and a {111} crystal plane, and one of the second PFET and the second NFET may be oriented on one of a {100} crystal plane, a {110} crystal plane, and a {111} crystal plane.

The present invention may also provide an improved process for fabricating CMOS FinFETs on the same substrate utilizing various crystal planes for FET current channels. In association with an embodiment of present invention, a method for forming a semiconductor structure may include the steps of: providing a substrate having a surface oriented on a first crystal plane that enables subsequent crystal planes for channels to be utilized; forming a first transistor so that a sidewall of a first fin body forms a first current channel and so that the sidewall of the first fin body is oriented on a second crystal plane to provide a first carrier mobility; and forming a second transistor so that a sidewall of a second fin body forms a second current channel and so that the sidewall of the second fin body is oriented on a third crystal plane to provide a second carrier mobility that is different from the first carrier mobility.

There are many exemplary variations of this embodiment. Accordingly, in a first variation, the step of providing a substrate may comprise the step of providing a substrate comprising single crystal silicon and/or having a surface oriented on a {110} crystal plane. In a second variation, the step of forming a first transistor may comprise the step of forming a first transistor so that the sidewall of the first fin body is oriented on a {n n m} plane and n and m are any integer, and the step of forming a second transistor may comprise forming a second transistor so that the sidewall of the second fin body is on a {a a b} plane and a and b are any integer such that the {n n m} plane and the {a a b} plane are not equivalent by a symmetry transformation.

In a third variation, the step of forming a first transistor may comprise the step of forming one of a first PFET and a first NFET, and the step of forming a second transistor may comprise the step of forming one of a second PFET and a second NFET. The step of forming one of a first PFET and a first NFET may comprise forming one of a first PFET and a first NFET so that the sidewall of the first fin body is oriented on a second crystal plane to provide one of an optimized carrier mobility and a non-optimized carrier mobility, and the step of forming one of a second PFET and a second NFET may comprise forming one of a second PFET and a second NFET so that the sidewall of the second fin body is oriented on a third crystal plane to provide one of an optimized carrier mobility and a non-optimized carrier mobility.

Thus, in a fourth variation for example, the step of forming one of a first PFET and a first NFET may comprise forming one of a first PFET and a first NFET so that the sidewall of the first fin body is oriented on one of a {100} crystal plane, a {110} crystal plane, and a {111} crystal plane, and the step of forming one of a second PFET and a second NFET may comprise forming one of a second PFET and a second NFET so that the sidewall of the second fin body is oriented on one of a {100} crystal plane, a {110} crystal plane, and a {111} crystal plane.

The foregoing and other features and advantages of the present invention will be apparent from the following more particular description of the invention, as illustrated in the accompanying drawings.

BRIEF DESCRIPTION OF THE DRAWINGS

Embodiments of the present invention will hereinafter be described in conjunction with the appended drawings, where like designations denote like elements.

DESCRIPTION OF THE INVENTION

As discussed above, the present invention exploits semiconductor physics by utilizing various crystal planes for FET current channels in order to optimize mobility and/or to reduce mobility in specific devices depending on the particular application. Individuals skilled in the art of semiconductor physics may wish to proceed with to the Detailed Description section of this specification. However, those individuals who are new to crystal lattice planes and directions, should read the following Overview section in order to best understand the benefits and advantages of the present invention.

1. Overview

In crystalline solids, the atoms which make up the solid are spatially arranged in a periodic fashion called a lattice. The crystal lattice always contains a volume which is representative of the entire lattice and it is regularly repeated throughout the crystal. The directions in a lattice are expressed as a set of three integers with the same relationship as the components of a vector in that direction. The three vector components are given in multiples of the basic vectors. For example, in cubic lattices, such as silicon that has a diamond crystal lattice, a body diagonal exists along the [111] direction with the [ ] brackets denoting a specific direction.

However, many directions in a crystal are equivalent by a symmetry transformation, depending on the arbitrary choice of orientation of the axes. For example, crystal directions in the cubic lattice [100], [010], and [001] are all crystallographically equivalent. In this application, a direction and all of its equivalent directions are denoted by < > brackets. Thus, the designation of the direction <100> includes the equivalent [100], [010], and [001] directions. Since these directions will also be on the negative side of the origin (as arbitrarily defined), unless specifically stated or shown otherwise in this application, a crystal direction includes both positive and negative integers. Accordingly, for example, the designation of the direction <100> includes the [−100], [0−10], and [00-1] directions in addition to the [100], [010], and [001] directions.

Planes in a crystal also may be determined with a set of three integers. They are used to define a set of parallel planes and each set of three integers in ( ) parentheses identify a specific plane. A plane identified by a specific set of three integers is perpendicular to a direction identified by the identical three integers. For example, the proper designation for a plane perpendicular to the [100] direction is (100). Thus, if either a direction or a plane of a cubic lattice is known, its perpendicular counterpart may be quickly determined without calculation.

As in the case of directions, many planes in a lattice are equivalent by a symmetry transformation. For example, the (100), (010), and (001) planes are planes of equivalent symmetry. In this application, a plane and all of its equivalent planes are denoted by { } parentheses. Thus, the designation of the plane {100} includes the equivalent (100), (010), and (001) planes. Like the crystal direction, a crystal plane in this application includes both positive and negative integers unless specifically stated or shown otherwise. Accordingly, for example, the designation of the plane {100} includes the (−100), (0−10), and (00-1) planes in addition to the (100), (010), and (001) planes.

2. Detailed Description

The present invention may be readily adapted to a variety of methods of fabricating complimentary metal oxide semiconductor (CMOS) fin field effect transistors (FinFETs) on the same substrate utilizing various crystal planes for FET current channels in order to optimize mobility and/or reduce mobility in specific devices as needed, thereby maintaining an acceptable and/or desired performance. It will be understood by one of ordinary skill in the art that the invention is not limited to the specific structures illustrated in the drawings or to the specific steps detailed herein. It will also be understood that the invention is not limited to use of any specific dopant types provided that the dopant types selected for the various components are consistent with the intended electrical operation of the device.

Figure 1:
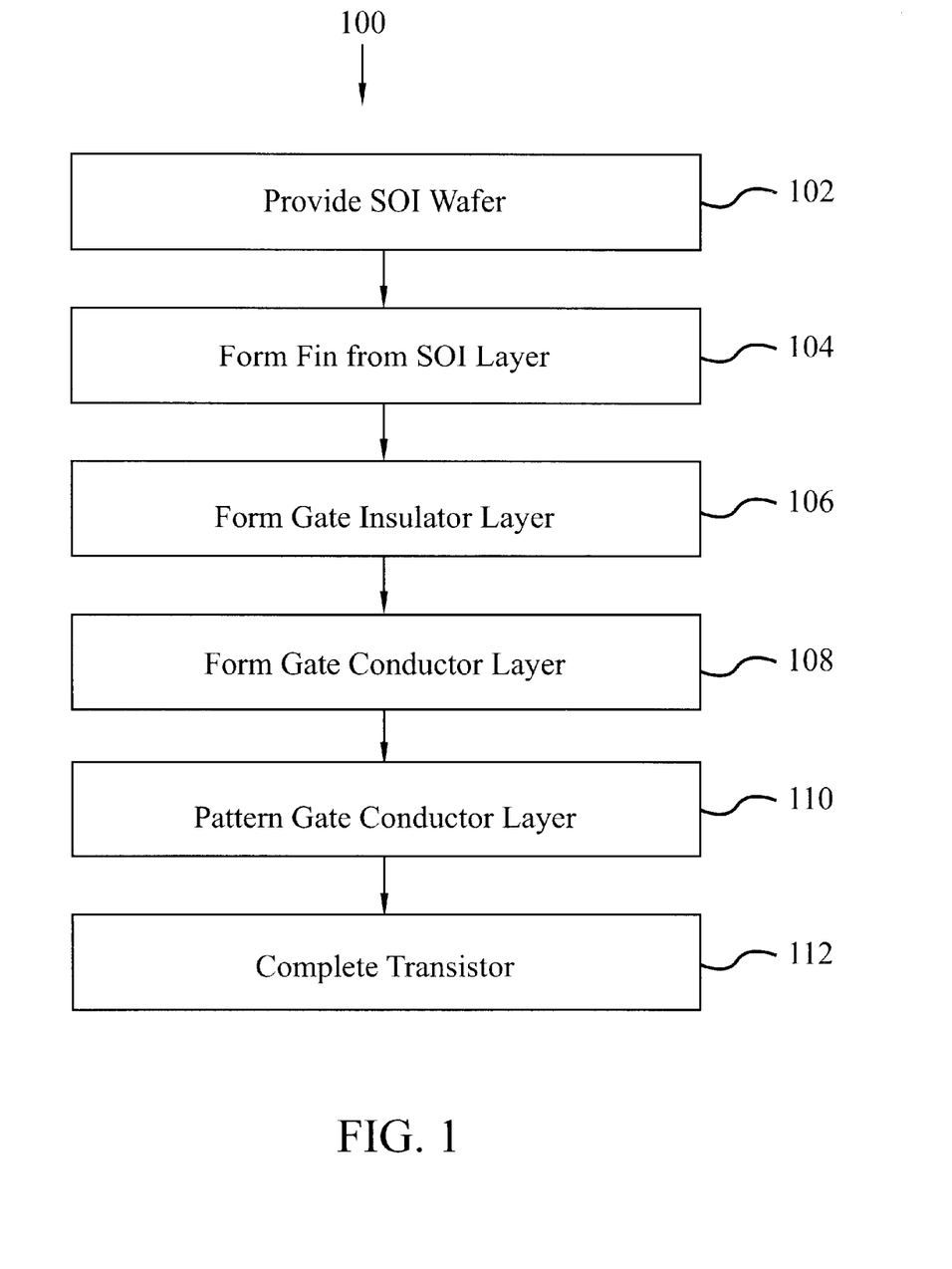
FIG. 1 is a flow diagram illustrating a fabrication method of the invention.

Turning now to FIG. 1, exemplary method 100 for forming CMOS FinFETs in accordance with the present invention is illustrated. FIGS. 2a–7a are top plan views and FIGS. 2b–7b are cross-sectional views, the respective views depicting various stages during method 100. Generally, fabrication method 100 of present invention may form CMOS FinFETs by: providing a substrate having a surface oriented on a first crystal plane that enables subsequent crystal planes for channels to be utilized; forming a first transistor so that a sidewall of a first fin body forms a first current channel and so that the sidewall of the first fin body is oriented on a second crystal plane to provide a first carrier mobility; and forming a second transistor so that a sidewall of a second fin body forms a second current channel and so that the sidewall of the second fin body is oriented on a third crystal plane to provide a second carrier mobility that is different from the first carrier mobility.

Particularly, first step 102 of method 100 is to provide an appropriate substrate having a surface oriented on a first crystal plane that enables subsequent crystal planes for FET current channels to be utilized, such as a {110} crystal plane for example. The proper alignment of the crystal lattice has a large effect on the material properties of the substrate, including its electrical properties (e.g. its carrier mobility properties) and how it reacts to other materials and chemical processing. As will be made clear, providing a substrate having a surface oriented on a {110} crystal plane for example enables method 100 to form FinFETs in a manner that for the first time enables subsequent crystal planes for the FET current channels to be utilized.

Therefore, method 100 of the present invention may be used to fabricate any combination of n-channel FinFETs (NFETs) and p-channel FinFETs (PFETs) on any combination of surface planes, such as the {100}, {110} and {111} for example. The electron mobility will be optimized for an NFET on {100} or {110} and the hole mobility will be optimized for a PFET on {111}, while the electron mobility will be reduced for an NFET on {111} and the hole mobility will be reduced for a PFET on {100}. Although the {100}, {110} and {111} are advantageously useful planes, many other combination of surface planes rotated 90° from the substrate surface plane may be realized employing method 100 of the present invention. That is, the equivalent planes accessible by method 100 may be represented by the plane {n n m} or the plane {a a b} for example, wherein n, m, a, b, etc. are any integer, such that the plane in {n n m} and the plane {a a b } are not equivalent by a symmetry transformation. Thus, method 100 of the present invention may be used to optimize carrier mobility and/or may be used to reduce mobility in specific devices, if needed.

Figure 2A:
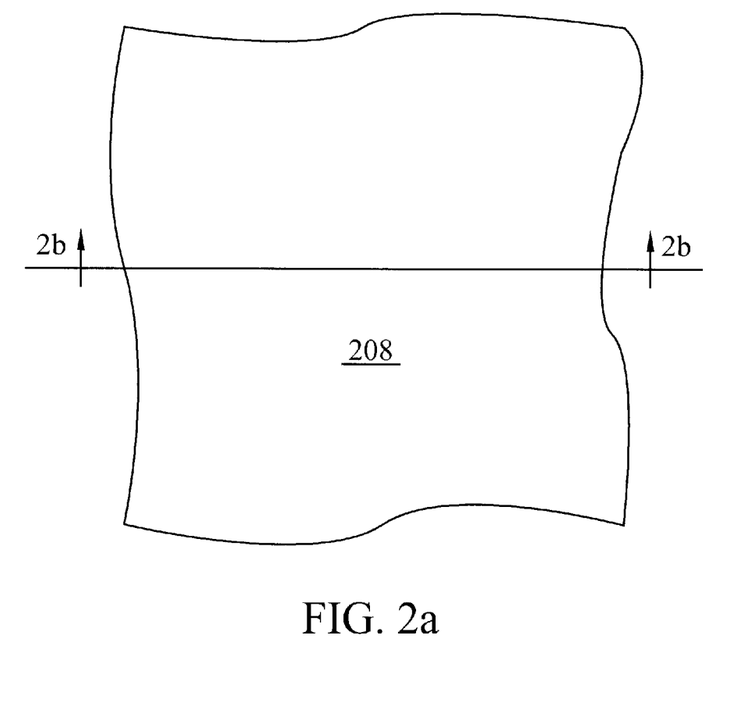
FIGS. 2a, 3a, 4a, 5a, 6a, and 7a are top plan views of an embodiment of a semiconductor structure of the invention during the fabrication method of FIG. 1.
Figure 2B:
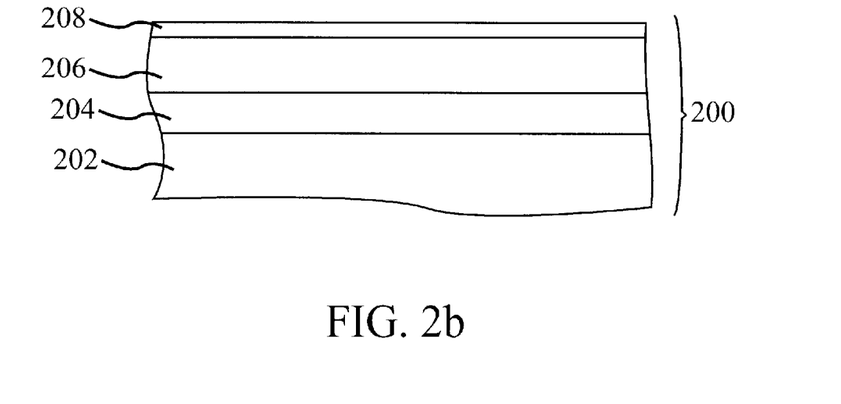
FIGS. 2b, 3b, 4b, 5b, 6b, and 7b are cross-sectional side views of an embodiment of a semiconductor structure of the invention during the fabrication method of FIG. 1 taken along lines 2b—2b, 3b—3b, 4b—4b, 5b—5b, 6b—6b, and 7b—7b of FIGS. 2a, 3a, 4a, 5a, 6a, and 7a respectively.

Referring now to the substrate embodiment depicted in FIGS. 2a–2b, substrate 200 may comprise wafer 202 that underlies buried insulator 204 that underlies semiconductor layer 206. Therefore, for example, substrate 200 may comprise a single crystal silicon-on-insulator (SOI) wafer. However, other substrate 200 embodiments may be used, such as a non-SOI wafer comprising only wafer 202 (i.e., a chip) for example. When a non-SOI wafer embodiment is used, the processing remains otherwise identical to that of a SOI wafer embodiment, except as noted.

Still referring to FIGS. 2a–2b, while wafer 202 is depicted as having a minimum of complexity, other wafers of varying complexity may be advantageously employed. Wafer 202 may be composed of any appropriate semiconducting material, including, but not limited to: Si, Ge, GaP, InAs, InP, SiGe, GaAs, or other III/V compounds. Wafer 202 has a surface oriented on a first crystal plane that allows subsequent surface planes for FET current channels to be utilized. For the exemplary purposes of this disclosure, wafer 202 may comprise single crystal silicon and have a surface oriented on a {110} crystal plane.

Buried insulator 204 may be formed on wafer 202 using thermal oxidation, such as rapid-thermal processing (RTP) or furnace processing for example, or other techniques known in the art. Buried insulator 204 may comprise any insulative material, such as Buried Oxide (BOX). However, any type and/or combination of buried insulators may be used for buried insulator 204.

Semiconductor layer 206 may be formed on buried insulator 204 by any technique known in the art, and may comprise any semiconductor material. Additionally, semiconductor layer 206 has a surface oriented on a first crystal plane that allows subsequent surface planes for FET current channels to be utilized. For the exemplary purposes of this disclosure, semiconductor layer 206 comprises a single crystal silicon-on-insulator (SOI) layer having a surface oriented on a {110} crystal plane. Semiconductor layer 206 may also have any thickness. For the exemplary purposes of this disclosure, semiconductor layer 206 may have a thickness between approximately 20 nm–160 nm. As will be made clear, semiconductor layer 206 thickness may define the height of the fins.

Turning now to FIGS. 2a–4b, step 104 of method 100 is to form one or more fins from semiconductor layer 206. As will be made clear, a portion of each fin (i.e., a fin body) acts as a transistor body. Any number of fins (and therefore FinFETs) may be formed on a substrate, and the fins may be formed in any of the previously proposed techniques. Accordingly, for the exemplary purposes of this disclosure, fins may be formed from semiconductor layer 206 in step 104 in the following manner.

The first step is to deposit hard mask film 208 as depicted in FIGS. 2a–2b. Hard mask film 208 acts as an etch stop layer and will be used throughout the CMOS FinFET fabrication process when needed. For the exemplary purposes of this disclosure, hard mask film 208 may be silicon dioxide ($SiO_2$) or silicon nitride ($Si_3N_4$).

A next step is implemented to pattern and etch hard mask film 208 by any technique known in the art. For example, a suitable thin layer of photoresist (PR) may be used to cover the surface of hard mask film 208. Next, a mask with a predetermined orientation may be used to generate a specific pattern of narrow lines on the PR overlying hard mask film 208. As will be made clear, the particular FinFET plane (the crystal plane that the electrons or holes are associated with) is defined by how the mask is oriented to facilitate etching that fin into substrate 200, as opposed to the particular crystal plane substrate 200 surface is oriented on. For the first time, selecting and implementing simple and predetermined mask changes according to method 100 of the present invention provides flexibility within substrate 200 to designate particular crystal planes for different devices. Accordingly, method 100 of the present invention may be used to fabricate any combination of NFETs and PFETs on any combination of surface planes represented by the plane {n n m} or the plane {a a b} for example, wherein n, m, a, b, etc. are any integer, such that the plane {n n m} and the plane {a a b} are not equivalent by a symmetry transformation. Thus, method 100 of the present invention may be used to optimize carrier mobility and/or may be used to reduce mobility in specific devices, if needed.

Figure 3A:
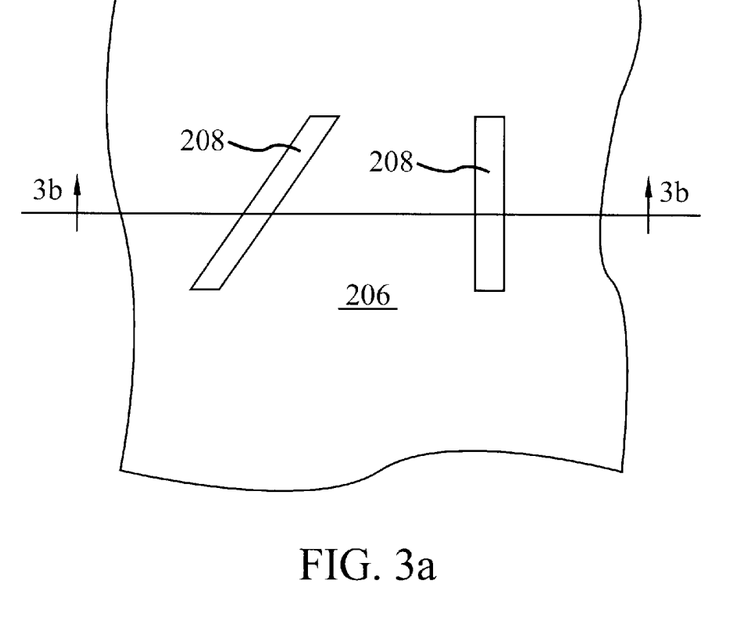
Figure 3B:
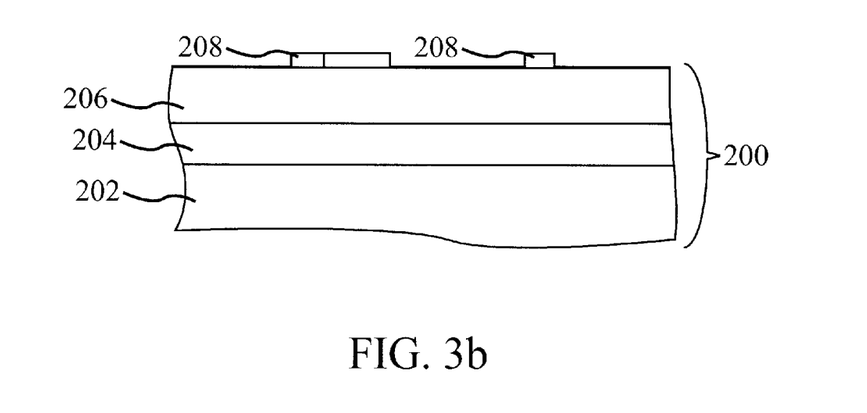

Once the narrow lines on the PR overlying hard mask film 208 are generated, then a suitable directional etch may be performed through hard mask film 208 to form narrow lines in hard mask film 208, which typically have a width in the range of approximately 0.3 nm to 40 nm. As will be made clear, the width of hard mask film 208 narrow lines translates into the thickness of the fins. The PR is then stripped away by a suitable chemical process, thereby resulting in hard mask film 208 narrow lines on semiconductor layer 206 as depicted in FIGS. 3a–3b.

Figure 4A:
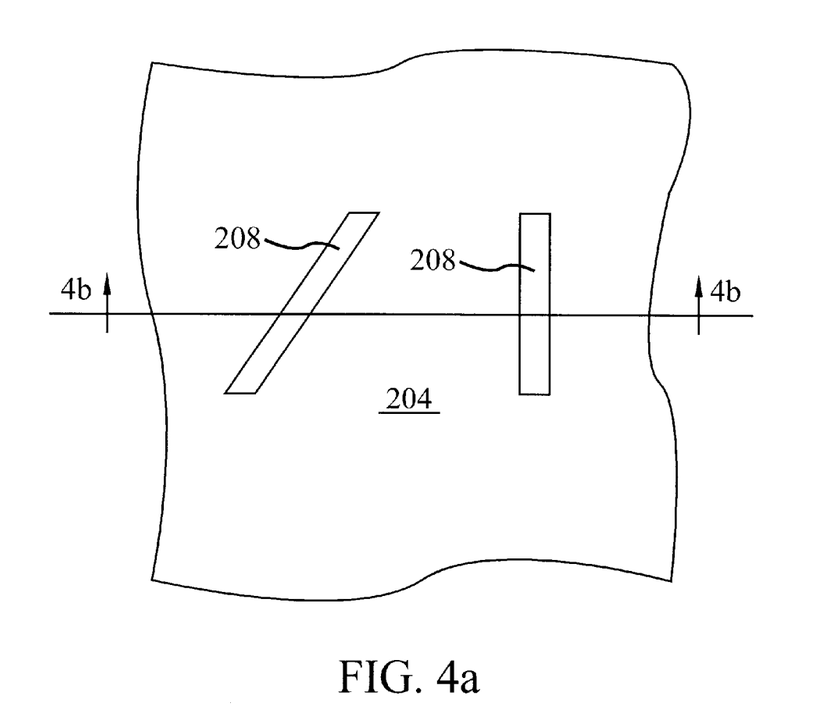
Figure 4B:
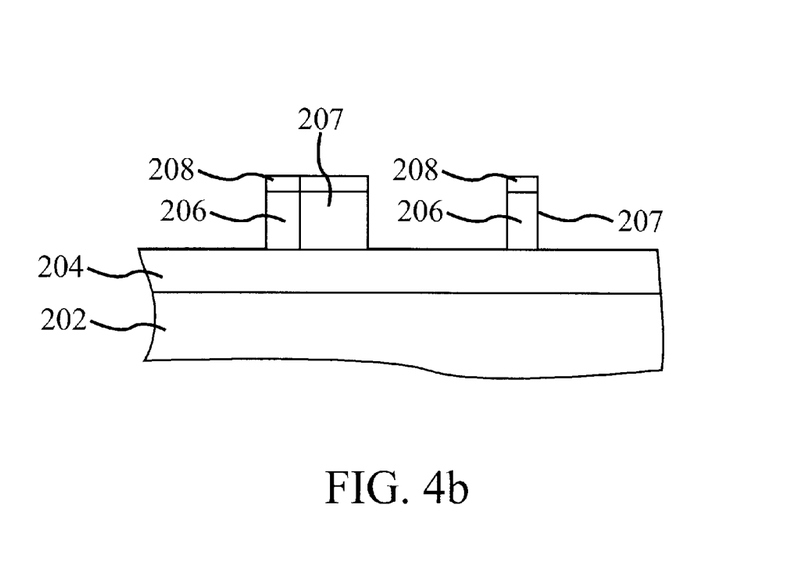

The next step is to anisotropically etch semiconductor layer 206 using hard mask film 208 narrow lines, thereby forming the fins. This may be done using a suitable reactive ion etch (RIE) process that etches semiconductor layer 206, stopping on buried insulator 204. Thus, as depicted in FIGS. 4a–4b, fins remain and comprise portions of semiconductor layer 206 with overlying hard mask film 208 narrow lines. The fins may have opposing vertical sidewalls 207 that are substantially perpendicular to buried insulator 204.

The predetermined orientation of the mask in a previous step has resulted in sidewalls 207 being oriented on particular crystal planes in order to optimize carrier mobility for both carrier types and/or reduce mobility in specific devices as needed, thereby maintaining an acceptable and/or desired performance. Accordingly, sidewalls 207 of the fin bodies may be oriented on a crystal planes that provide different carrier mobilities. Sidewalls 207 of the fin bodies may also be oriented on a {n n m} plane, wherein n and m are any integer, and/or sidewalls 207 of the fin bodies may be oriented on a {a a b} plane, wherein a and b are any integer, such that the plane {n n m} and the plane {a a b} are not equivalent by a symmetry transformation. Additionally, sidewalls 207 of the fin bodies may oriented on crystal planes that provide one of an optimized carrier mobility and a non-optimized (i.e. anything less than optimized) carrier mobility. Furthermore, sidewalls 207 of the fin bodies may be oriented on a crystal planes that are not equivalent to one another by a symmetry transformation. Moreover, sidewalls 207 of the fin bodies may oriented on one of a {100} crystal plane, a {110} crystal plane, and a {111} crystal plane.

The fins may then be doped as needed. Typically, this may include an ion implantation into the fins so as to form P-well structures and N-well structures. In the CMOS technology of the present invention, P-well structures and N-well structures are formed to allow the integration of NFETs and PFETs in a common substrate. P, As and Sb, for example, are well suited for PFETs. B, In and Ga, for example, are well suited for NFETs. Ion implantation is typically designed to achieve a concentration of between $1 \times 10^{17}$ cm$^{-3}$ to $5 \times 10^{18}$ cm$^{-3}$ for example. In one embodiment, ion implantation may comprise an angled implant into exposed opposing vertical sidewalls 207 of semiconductor layer 206, and would serve to properly dope the fins.

When a non-SOI wafer embodiment is used, such as just wafer 202 for example, after the fins are etched by time to the desired depth (typically approximately 50 nm–200 nm below wafer 202 surface), a deposit/etch oxide process is used to deposit $SiO_2$ exclusively on the bottom horizontal surfaces of etched wafer 202 of a thickness approximately one-quarter the height of the etched fins. The oxide may be doped with, for example, B in the case of NFETs or P in the case of PFETs, and some portion of the dopant out-diffused into those portions of the fins immediately adjacent to the doped oxide. This serves to suppress leakage in what will be non-gated sidewalls of the fins, from source to drain.

As described above, this completes one exemplary manner of implementing step 104 to form one or more fins from semiconductor layer 206, or in wafer 202, as the case may be. As described in more detail below, in either case, gated sidewalls of the fin bodies may form current channels in between the exposed (non-gated) portions of the fins comprising source and drain regions. FinFET sidewalls forming current channels may be oriented on a {n n m} plane, where n and m are any integer, or on a {a a b} plane, where a and b are any integer, such that the {n n m} plane and the {a a b} plane are not equivalent by a symmetry transformation. The sidewalls may be oriented on crystal planes that provide different carrier mobilities. For example, the sidewalls may be oriented on crystal planes that provide one of an optimized carrier mobility and a non-optimized carrier mobility. Additionally, FinFET sidewalls may be oriented on one of a {100} crystal plane, a {110} crystal plane, and a {111} crystal plane. The {111} crystal plane optimizes carrier mobility for a PFET, and both the {100} crystal plane and the {110} crystal plane optimize carrier mobility for an NFET. On the other hand, the {100} crystal plane fails to optimize carrier mobility for a PFET, and the {111} crystal plane fails to optimize carrier mobility for an NFET.

Figure 5A:
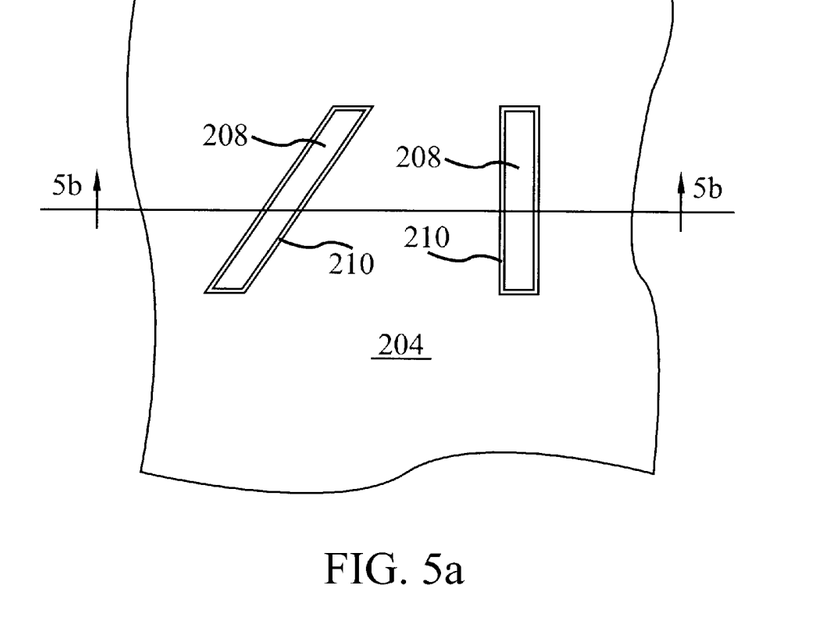
Figure 5B:
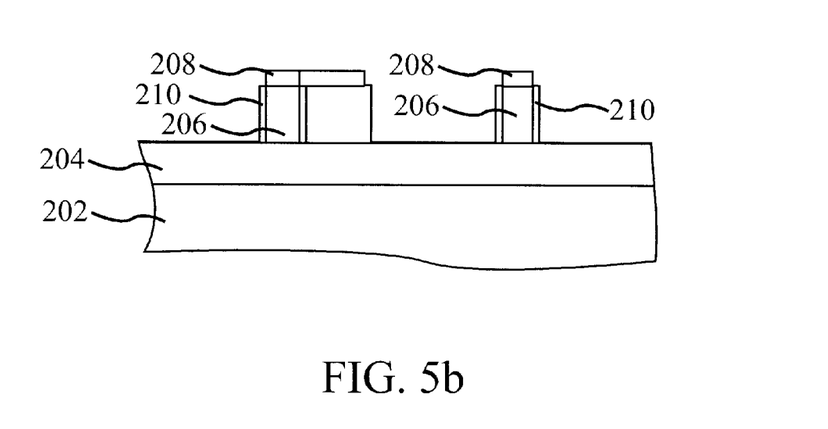

The next steps 106–110 of method 100 form gate stacks. Accordingly, in step 106, gate insulator layers 210 are formed on opposing vertical sidewalls 207 and opposing end walls of the fins (i.e., semiconductor layer 206 portions) as depicted in FIGS. 5a–5b. Gate insulator layers 210 may be formed by thermal oxidation, typically at 750–800° C., or alternatively, may be formed by depositing a dielectric film. For the exemplary purposes of this disclosure, gate insulator layers 210 may be $SiO_2$, a nitrided oxide material, a high-K dielectric material, or combinations thereof, as known in the art.

Figure 6A:
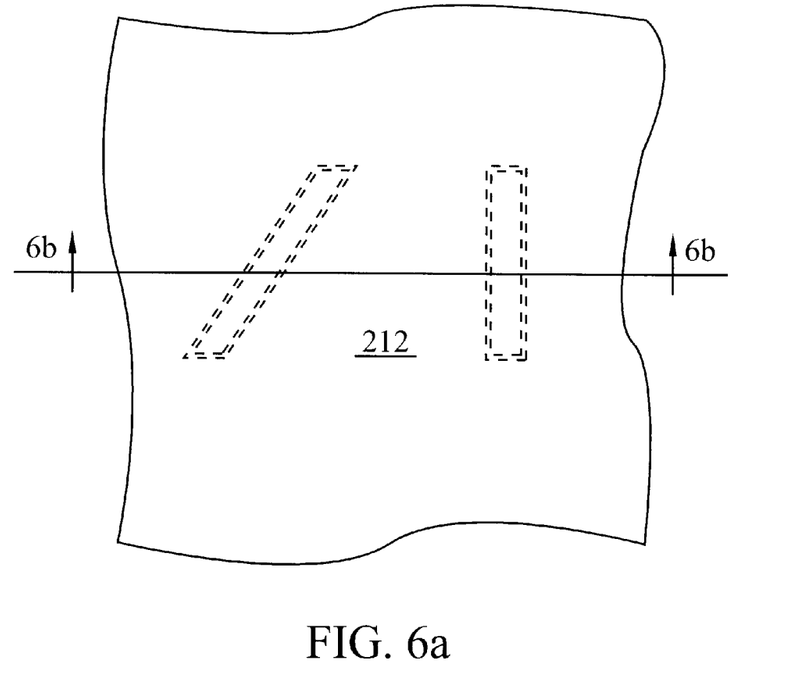
Figure 6B:
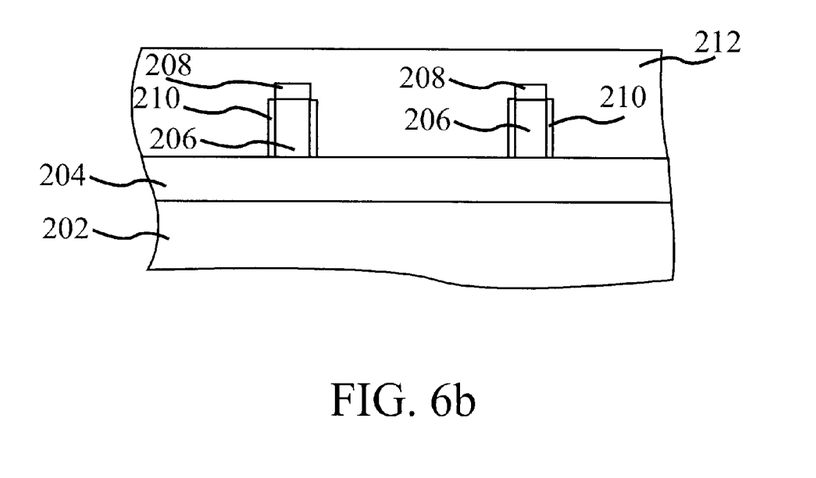

As depicted in FIGS. 6a–6b, step 108 of method 100 is to form gate conductor layer 212 overlying hard mask film 208 narrow lines, oxide layers 210, and buried insulator 204. Gate conductor layer 212 may be any suitable conducting material, typically a polycrystalline silicon material, although amorphous silicon, a combination of amorphous silicon and polysilicon, polysilicon-germanium, or any other appropriate material may be used to form gate conductor layer 212. In addition, in some embodiments of the present invention, it might be advantageous to employ a metal gate conductor layer 212, such as W, Mo, or Ta, or any other refractory metal, or alternatively a silicided gate conductor comprising polysilicon added with Ni or Co. In step 108, where gate conductor layer 212 encompasses a silicon material, such layers may be deposited as a doped layer (in-situ doping). Where gate conductor layer 212 is a metal layer, such layers may be deposited using physical vapor or chemical vapor deposition methods or any other technique known in the arc. In this manner, gate structures are formed adjacent to oxide layers 210 firmed on opposing vertical sidewalls 207 of the fins formed by semiconductor layer 206 portions.

Figure 7A:
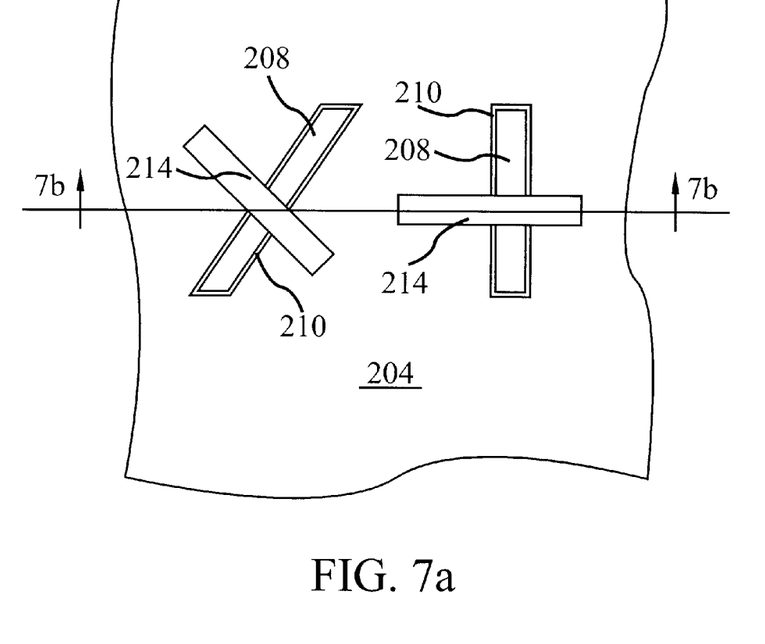
Figure 7B:
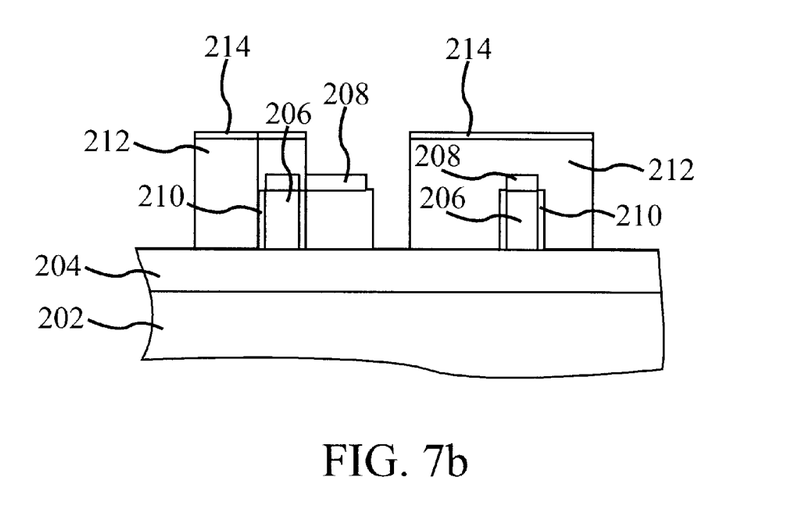

Turning to FIGS. 7a–7b, the next step 110 of method 100 is to pattern gate conductor layer 212. To implement step 110, hard mask film 214 is formed and patterned to facilitate the patterning of gate conductor layer 212. Typically, hard mask film 214 material may be $SiO_2$ or $Si_3N_4$. Continuing with step 110, gate conductor layer 212 is patterned. Accordingly, gate conductor layer 212 may be patterned and structured using well known photolithography and etching techniques to form the gate stack, i.e, using hard mask film 214 caps as an etch mask during a directional etching of gate conductor layer 212. This involves selectively removing portions of gate conductor layer 212 down to buried insulator 204, but does not remove the portions of semiconductor layer 206 forming the fins that are protected by hard mask film 208 narrow lines. Therefore, the fins may extend beyond the gate stack. The patterning and structuring also leaves portions of gate conductor layer 212, which define the gate structures adjacent the fin bodies.

Thus, in FIGS. 7a–7b, an embodiment of the present invention is depicted having a minimum of complexity. This depicted embodiment of the present invention is at a stage of a process flow technique modified by a fabrication method of the present invention for forming CMOS FinFETs on the same substrate utilizing various crystal planes for FET current channels. Particularly in this embodiment, wafer 202 is depicted with an overlying buried insulator 204. On top of buried insulator 204 are semiconductor layer 206 portions comprising the fins with overlying hard mask film 208 narrow lines. Gate insulator layers 210 are formed on opposing vertical sidewalls 207 and opposing end walls of the fins. As made clear, overlying the fin bodies are gate stacks that comprise: gate insulator layers 210 portions formed on opposing vertical sidewalls 207 portions of the fin bodies; gate conductor layer 212 portions (i.e., gates) overlying gate insulator layers 210 portions and hard mask film 208 narrow line portions overlying the fin bodies; and hard mask film 214 caps overlying gate conductor layer 212 portions. In this particular embodiment and for the exemplary purposes of this disclosure, PFET sidewalls are oriented on a { 111 } crystal plane, which provides the optimum carrier mobility for a PFET, while NFET sidewalls are oriented on a {100} crystal plane, which provides an optimum carrier mobility for a NFET. Also in this particular embodiment, gate conductor layer 212 portions do not connect with one another, but in other embodiments, such as the embodiment depicted in FIG. 8 that will hereinafter be described, similar gate conductor layer 314 portion is unitary.

The FinFET embodiments of FIGS. 7a–7b or any other FinFET embodiments of the present invention utilizing different crystal planes for FET current channels, may be completed according to step 112 of method 100. Accordingly, exposed portions of the fins may be doped to form S/D regions. The S/D regions may define, in semiconductor layer 206 portions comprising the fin bodies, channel regions underlying the gate stacks. Formation of the S/D regions may be accomplished using any of the variety of methods that have been developed to form SD region and that are tailored for specific performance requirements. There are many such methods for forming S/D regions having various levee of complexity. Thus, in some embodiments of the present invention, using ion implantation for example, lightly doped S/fl regions or other S/D regions may be formed. Thus, for NFETS, typically P, As, or Sb for example is used for the S/D implants in the range of 1 to 5 keV and a dose of $5\times10^{14}$ to $2\times10^{15}$ cm$^{-3}$. Similarly, for PFETS, typically B, In, or Ga for example is used for the S/D implants in the range of 0.5 to 3 key and dose of $5\times10^{14}$ to $2\times10^{15}$ cm$^{-3}$.

Optionally, extension and halo implants may be formed that improve Short Channel Effects (SCE). For NFETs, typically B, In, or Ga may be used for the halo implants with energies in the range of 5 to 15 keV and a dose of $1\times10^{13}$ to $8\times10^{13}$ cm$^{-3}$. Similarly, for PFETs, P, As, or Sb may be used for the halos, with energies from 20 to 45 keV and dose of $1\times10^{13}$ to $8\times10^{13}$ cm$^{-3}$.

Continuing with step 112, contacts to sources, drains, and gates may then be formed. Accordingly, an inter metal dielectric may be deposited and planarized typically using a CMP process. Contact holes may then be structured and etched using an anisotropic process (e.g. RIE) or the like. The contact holes may be filled using any conducting material, such as doped polysilicon, silicide (e.g. WSi), metals (e.g. Au, Al, Mo, W, Ta, Ti, Cu, or ITO (indium-tin oxide)), or the like, being deposited by evaporation, sputtering, or other known techniques, thereby forming S/D contacts. Then the first metal layer may be deposited and structured using a RIE process or the like. Alternatively, the structuring of the first metal layer may be done following a damacene process flow.

CMOS FinFETs on the same substrate utilizing various crystal planes for FET current channels according to the present invention may be used in many different kinds of circuits, such as high performance logic, low power logic or high density memory devices, including high density multi-gigabit DRAMs. Moreover, the inventive CMOS FinFETs may readily be combined with other elements, such as for example capacitors, resistors, diodes, memory cells and so forth.

Figure 8:
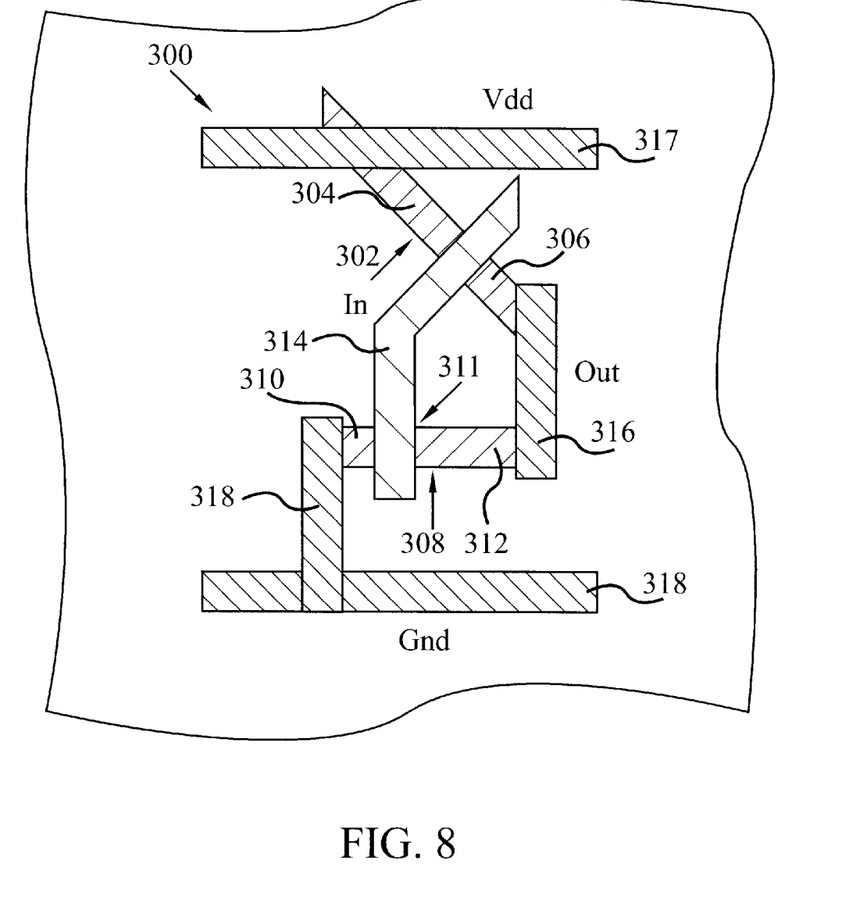
FIG. 8 is an embodiment of a FinFET CMOS inverter of the invention.
Figure 9:
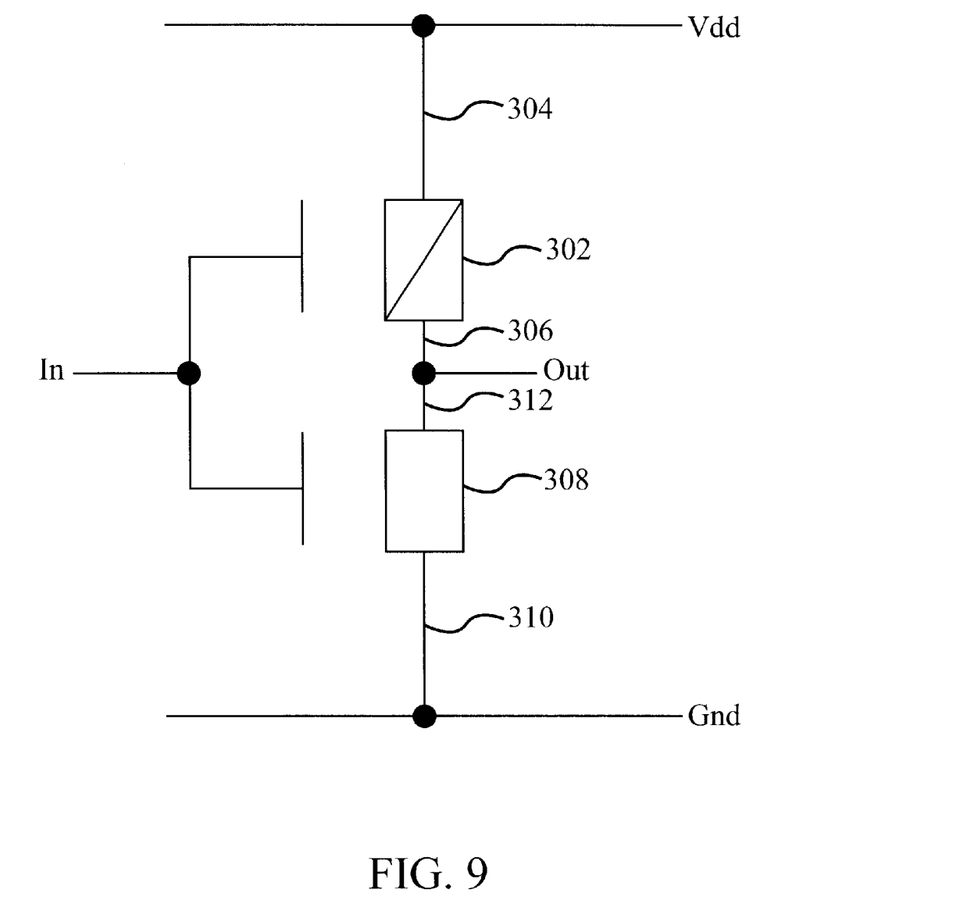
FIG. 9 is a circuit diagram of the FinFET CMOS inverter of FIG. 8.

Describing one use of the inventive CMOS FinFETs further by way of a particular example, one of the most important CMOS gates is the CMOS inverter because it performs logical inversion and is the building block for all digital circuits. The logic function of the inverter is simply to change the state of the input from a 0 to a 1 or from a 1 to a 0. In association with an embodiment of the invention, FinFET CMOS inverter 300 is depicted in FIG. 8 and a circuit diagram relating the various elements of FinFET CMOS inverter 300 is depicted in FIG. 9. FinFET CMOS inverter 300 may be fabricated by method 100 as previously described, and as such, it includes all of the benefits and advantages outlined previously in conjunction with the description of method 100.

Accordingly, FinFET CMOS inverter 300 may be formed from a pair comprising PFET 302 and NFET 308. PFET 302 and NFET 308 are: joined at their respective drains 306 and 312 by local wiring 316 portion where the output (Out) is taken; and joined at their respective gates 305 and 311 by gate conductor 314 portion where the input (In) is taken. The pair is supplied with power supply voltage (Vdd) along local wiring 317 portion connected to source 304 of PFET 302, and the pair is connected to ground (Gnd) from source 310 of NFET 308 connected to local wiring 318 portion. Thus, in this manner is the series combination connected from Vdd to Gnd.

FinFET CMOS inverter 300 acts as a switching circuit, since PFET 302 has exactly the opposite characteristics of NFET 308. Generally, PFET 302 and NFET 308 are switched by the input voltage. When the input is low, PFET 302 turns on. On the other hand, when the input is high, NFET 308 is turned on. PFET 302 and NFET 308 do not switch on at the same time, which prevents DC current from Vdd to the Gnd. Particularly, as depicted in FIG. 8 and for the exemplary purposes of this disclosure, PFET 302 is formed so that it is oriented on a {111} crystal plane and NFET 308 is formed so that it is oriented on a {100} crystal plane, in contrast to conventional planar CMOS that cannot utilize different surface planes for different devices. Therefore, by providing a substrate surface oriented on a 110 crystal plane and implementing simple mask changes that provide flexibility within the substrate to designate particular crystal planes for different devices, FinFET CMOS inverter 300 achieves an optimum mobility for holes and electrons, thereby increasing the switching speed of PFET 302 and NFET 308.

In summary, in contrast to conventional planar CMOS technologies, the present invention may provide CMOS FinFETs on the same substrate utilizing various crystal planes for FET current channels without any complex device engineering. Additionally, since rotating a FinFET design according to the present invention, unlike rotating planar FET designs, changes the actual planar surface of the device, a mobility change may be realized. Thus, by forming multiple FinFETs on various crystal planes on the same substrate, multiple different carrier mobilities may be realized in order to optimize mobility and/or reduce mobility in specific devices as needed, thereby maintaining an acceptable and/or desired performance.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A semiconductor structure comprising a chip comprising:
   a first single crystal semiconductor sidewall channel oriented on a first crystal plane; and
   a second single crystal semiconductor sidewall channel oriented on a second crystal plane different from the first crystal plane;

wherein the first crystal plane is not equivalent to the second crystal plane by a symmetry transformation.

2. The semiconductor structure of claim 1, wherein a first mobility is associated with the first crystal plane and a second mobility is associated with the second crystal plane, wherein the first mobility is different from the second mobility.

3. The semiconductor structure of claim 1, wherein the chip has a surface oriented on a {110} crystal plane.

4. The semiconductor structure of claim 1, wherein the first single crystal semiconductor sidewall channel is part of a first FinFET and the second single crystal semiconductor sidewall channel part of a second FinFET.

5. The semiconductor structure of claim 4, wherein the first FinFET is one of a first p-channel FinFET (PFET) and a first n-channel FinFET (NFET), wherein the second FinFET is one of a second PFET and a second NFET.

6. The semiconductor structure of claim 5, wherein a sidewall of one of the first PFET and the first NFET is oriented on said first crystal plane to provide coo of an optimized carrier mobility and a non-optimized carrier mobility, wherein a sidewall of one of the second PFET and the second NFET is oriented on said second crystal plane to provide one of an optimized carrier mobility and a non-optimized carrier mobility.

7. The semiconductor structure of claim 5, wherein a sidewall of one of the first PFET and the first NFET is oriented on one of a {100} crystal plaza, a {110} crystal plane, and a {111} crystal plane, wherein a sidewall of one of the second PFET and the second NFET is oriented on one of a {100} crystal plane, a {110} crystal plane, and a {111} crystal plane.

8. A semiconductor structure comprising:

a substrate having a surface oriented on a first crystal plane that enables subsequent crystal planes channels to be utilized;

a first transistor having a first fin body, the first find body have a sidewall forming a first channel, the sidewall of the first fin body oriented on a second crystal plane to provide a first carrier mobility; and a second transistor having a second fin body, the second flu body having a sidewall forming a second channel, the sidewall of the second fin body oriented on a third crystal plane to provide a second carrier mobility that is different from the first carrier mobility.

9. The semiconductor structure of claim 8, wherein the substrate is a silicon substrate having oriented on (110) crystal plane.

10. The semiconductor structure of claim 8, wherein the sidewall of the first fin body is oriented on a {n n m} plane and n and m are any integer, wherein the sidewall of the second fin body is oriented on a {a a b} plane and a and b are any integer such that the {n n m} plane and the {a a b} plane are not equivalent by a symmetry transformation.

11. The semiconductor structure of claim 8, wherein the first transistor is one of a first p-channel FinFET (PFET) and a first n-channel FinFET (NFET), wherein the second transistor is one of a second PFET and a second NFET.

12. The semiconductor structure of claim 10, wherein the sidewall of the first fin body of one of the first PFET and the first NFET is oriented on said second crystal plane to provide one of an optimized carrier mobility and a non-optimized carrier mobility, wherein the sidewall of the second fin body of one of the second PFET and the second NFET is oriented on said third crystal plane to provide one of an optimized carrier mobility and a non-optimized carrier mobility.

13. The semiconductor structure of claim 9, wherein the sidewall of the first fin body of one of the first FEET and the first NFET is oriented on one of a {100} crystal plane, a {110} crystal plane, and a {111} crystal plane, wherein the sidewall of the second fin body of one of the second PFET and the second NFET is oriented on one of a {100} crystal plane a {110} crystal plane, and a {111} crystal plane.

* * * * *